United States Patent
Kim et al.

(10) Patent No.: US 7,566,928 B2
(45) Date of Patent: Jul. 28, 2009

(54) BYTE-OPERATIONAL NONVOLATILE SEMICONDUCTOR MEMORY DEVICE

(75) Inventors: Sung-ho Kim, Osan-si (KR); Nae-in Lee, Gwanak-gu (KR); Kwang-wook Koh, Seongnam-si (KR); Geum-jong Bae, Incheon Metropolitan (KR); Ki-chul Kim, Suwon-si (KR); Jin-hee Kim, Seongnam-si (KR); In-wook Cho, Yongin-si (KR); Sang-su Kim, Suwn-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 261 days.

(21) Appl. No.: 11/269,624

(22) Filed: Nov. 9, 2005

(65) Prior Publication Data

US 2006/0054965 A1    Mar. 16, 2006

Related U.S. Application Data

(62) Division of application No. 10/808,497, filed on Mar. 25, 2004, now abandoned.

(30) Foreign Application Priority Data

Apr. 18, 2003 (KR) ............................... 2003-24779

(51) Int. Cl.
*H01L 29/788* (2006.01)
(52) U.S. Cl. ...................................... 257/315; 257/314
(58) Field of Classification Search ................. 257/315, 257/316, 318, E21.68, 314, 182, 185; 365/185, 365/28
See application file for complete search history.

(56) References Cited

U.S. PATENT DOCUMENTS

| 5,612,913 | A | * | 3/1997 | Cappelletti et al. ...... 365/185.12 |
| 5,687,118 | A |  | 11/1997 | Chang |
| 5,780,893 | A | * | 7/1998 | Sugaya ........................ 257/318 |
| 5,889,303 | A | * | 3/1999 | Eckert et al. ................. 257/316 |
| 6,400,603 | B1 |  | 6/2002 | Blyth et al. |
| 6,420,753 | B1 | * | 7/2002 | Hoang ......................... 257/321 |
| 6,445,030 | B1 |  | 9/2002 | Wu et al. |
| 6,717,850 | B1 | * | 4/2004 | Li et al. .................. 365/185.09 |
| 6,794,711 | B2 |  | 9/2004 | Kang et al. |
| 2002/0114185 | A1 |  | 8/2002 | Blyth et al. |
| 2002/0191439 | A1 | * | 12/2002 | Caywood ............... 365/185.06 |

FOREIGN PATENT DOCUMENTS

| CN | 1405876 | 3/2003 |
| KR | 1020000017357 | 3/2000 |

* cited by examiner

*Primary Examiner*—Thinh T Nguyen
(74) *Attorney, Agent, or Firm*—Volentine & Whitt, P.L.L.C.

(57) ABSTRACT

Byte-operational nonvolatile semiconductor memory devices are capable of erasing stored data one byte at a time. A byte memory cell may include a memory cell array of 1-byte memory transistors. The 1-byte memory transistors may be arranged in one direction, each including a junction region and a channel region formed in an active region. A byte memory cell may include a byte select transistor. The select transistor may be disposed in the active region and including a junction region that is directly adjacent to a junction of each of the 1-byte memory transistors. The byte select transistor may be disposed over or under the 1-byte memory transistors perpendicular to the arranged direction of the 1-byte memory transistors.

18 Claims, 5 Drawing Sheets

US 7,566,928 B2

BYTE-OPERATIONAL NONVOLATILE SEMICONDUCTOR MEMORY DEVICE

CROSS-REFERENCE TO RELATED APPLICATIONS

This is a divisional of application Ser. No. 10/808,497, filed Mar. 25, 2004 now abandoned, which is incorporated herein by reference in its entirety, which claims the priority of Korean Patent Application No. 2003-24779, filed on Apr. 18, 2003, in the Korean Intellectual Property Office, the disclosure of which is incorporated herein in their entirety by reference.

BACKGROUND OF THE INVENTION

1. Field of the Invention

Embodiments of the present invention relate to a nonvolatile memory (NVM) device, which is a byte-operational nonvolatile semiconductor memory device.

2. Description of the Related Art

Nonvolatile semiconductor memory devices are able to retain data even when power is not supplied. Nonvolatile semiconductor memory devices may be classified into mask ROMs, EPROMs, and EEPROMs. Bulk-erasable EEPROMs are often called flash memories or flash EEPROMs. Each 1-bit memory cell of an EEPROM may include a pair of transistors, a bit select transistor, and a memory transistor. A bit select transistor is for selecting a bit memory cell. A memory transistor is for storing data. An EEPROM memory transistor operates utilizing a Fowler-Nordheim tunneling (F-N tunneling) mechanism when programming data or erasing data. Bulk-erasable flash memory devices are able to erase groups of data stored in memory cells at one time. Bulk-erasable flash memory devices may be classified as block-erasable, sector-erasable, or page-erasable flash memory devices in accordance with the amount of data erasable at one time. Each 1-bit memory cell of a bulk-erasable flash memory device may include a single memory transistor.

Flash memory devices may be categorized as either NAND-type devices or NOR-type devices according to the connection state of memory cells. Although a NAND-type flash memory can rapidly program and erase data, NAND-type flash memory are not capable of random access. However, a NOR-type flash memory is capable of random access, but is slow at programming and erasing data. NAND-type flash memory and NOR-type flash memory differ in operating mechanisms. During erase operations, both NAND-type and NOR-type flash memories utilize a F-N tunneling phenomenon. However, during program operations, while the NAND-type flash memory operates using F-N tunneling, the NOR-type flash memory operates using a channel hot electron injection (CHEI) phenomenon. According to the CHEI phenomenon, a difference in electrical potential between a source and a drain causes carriers to flow, while a relatively high or low voltage is applied to a gate electrode. Accordingly, electrons or holes are injected into or trapped in a floating gate or an insulating layer (e.g. a nitride layer). Since trapping of electrons or holes occurs adjacent to a source, this method is often referred to as source side injection (SSI).

Nonvolatile memory devices are used in a variety of applications and new applications continue to be aggressively developed. For example, nonvolatile memory devices are employed in embedded memories of memory cards. Memory cards (e.g. flash memories) are popular as storage media in portable digital electronic devices, such as mobile phones, set-top boxes, MP3 players, digital cameras, camcorders, and PDAs.

Usefulness of nonvolatile memory devices may be increased if they operate to erase data one byte at a time. An example of byte-operational nonvolatile memory devices is disclosed in U.S. patent application Ser. No. 10/022,314 (U.S. Patent Application Publication No. 2002/0114185 A1). FIG. 1 is a description of a byte-operational nonvolatile memory device based on U.S. patent application Ser. No. 10/022,314. FIG. 1 is a diagram of a memory cell equivalent circuit of a byte-operational nonvolatile semiconductor memory device. In FIG. 1, a "byte memory cell" (i.e. an 8-bit unit memory cell) is illustrated inside the dotted lines.

In FIG. 1, the byte memory cell comprises a memory cell block and a byte-operational block. The memory cell block includes 8 single-bit memory cells. Each single-bit memory cell includes a pair of transistors connected in series. The pair of transistors include the memory transistor 110 and the bit select transistor 120. The memory transistor 110 has a gate electrode structure of a stacked floating gate type, which operates through F-N tunneling in both programming and erasing operations. The byte-operational block also includes the byte select transistor 130. Source S of the bit select transistor 120 is connected to drain D of the memory transistor 110. Drain D of the bit select transistor 120 is connected to a bit line (e.g. $BL_{mo}$). Each bit line is connected in parallel to a memory transistor arrayed in another byte memory cell in the same column. Drain D of the byte select transistor 130 is connected to an mth program line $GSL_m$. Source S of the byte select transistor 130 is connected to the gate G of the memory transistor 110. Gates G of the bit select transistors 120 and the byte select transistor 130 are commonly connected to an nth word line $WL_n$. The nth word line $WL_n$ is connected to both the bit select transistor 120 and the byte select transistor 130 in another byte memory cell arrayed in the same row.

A nonvolatile semiconductor memory device of FIG. 1 has specific characteristics. For instance, since the byte select transistor 130 is capable of selecting single-bit memory cells in groups of a byte, it is also possible to erase data stored in the single-bit memory cells in groups of a byte. Also, in the nonvolatile memory device of FIG. 1, voltage transmitted through the byte select transistor 130 is applied to gate G of the memory transistor 110 in programming, erasing, and reading. Accordingly, voltage characteristics of source S have a great influence on operating characteristics of the semiconductor memory device, whereas the amount of current flowing through a channel of the byte select transistor 130 is not an important factor. Because current is not an important factor, the byte select transistor 130 can be disposed on the side of each byte memory cell. Accordingly, it is not necessary for the channel width of the byte select transistor 130 to have a large channel width.

SUMMARY OF THE INVENTION

Embodiments of the present invention relates to a nonvolatile semiconductor memory device having a highly integrated memory cell layout, which allows data stored in groups of a byte to be erased. A nonvolatile semiconductor memory device may comprise a semiconductor substrate 1-byte memory transistors, and/or a byte select transistor. An active region and an isolation region may be defined on the semiconductor substrate. The 1-byte memory transistors may be arranged in one direction. Each of the memory transistors include a junction region and a channel region formed in the active region. The byte select transistor may be disposed in the active region and include a junction region that is directly adjacent to the junction of each of the 1-byte memory transistors.

The byte select transistor may be disposed over or under the 1-byte memory transistors, perpendicular to the direction in which the 1-byte memory transistors are arranged. The junction of each of the 1-byte memory transistors that is directly adjacent to the junction of the byte select transistor may be a source region. The junction of the byte select transistor that is directly adjacent to the junction of each of the 1-byte memory transistors may be a drain region. Also, the junction region and a channel region of the byte select transistor may be disposed in an undoped native semiconductor substrate or in a doped conductive well region. When the junction region and the channel region of the byte select transistor are disposed in the doped conductive well region, the junction region and the channel region of the 1-byte memory transistor may be disposed in the doped conductive well region. Each of the 1-byte memory transistors may be a device utilizing source side injection (SSI) during operation.

The width of a channel region of the byte select transistor may be larger than the sum of the widths of the channel regions of the 1-byte memory transistors. Also, the width of the channel region of the byte select transistor may be equal to or larger than the sum of the widths of the channel regions of the 1-byte memory transistors and the widths of the isolation regions between adjacent 1-bit memory transistors. The isolation regions may be disposed at the semiconductor substrate.

Each of the 1-byte memory transistors is a floating-gate-type transistor. The memory transistors may be one of a SONOS-type transistor and a MONOS-type transistor (hereinafter, both referred to as a "SONOS-type transistor"). A gate electrode structure of a SONOS-type memory may include a first oxide layer, a nitride layer, a second oxide layer, and/or a conductive layer. These layers are sequentially stacked and may have the same thickness. In embodiments, a gate electrode structure of the SONOS-type transistor includes a first oxide layer and a nitride layer. The nitride layer may have a thickness smaller than a first oxide layer. A second oxide layer and a conductive layer may both have the same thickness as the first oxide layer, which are sequentially stacked.

In embodiments of the present invention, a byte-operational nonvolatile semiconductor memory device includes a plurality of byte memory cells. Each of the byte memory cells may include a memory cell block including 1-byte memory transistors arranged in one direction. Each of the byte memory cells may also include a byte-operational block including a byte select transistor. The byte-operational block may be disposed over or under the memory cell block and perpendicular to the direction in which the 1-byte memory transistors are arranged.

Embodiments of the present invention relate to a device including a plurality of bit lines. The bit lines are electrically connected to respective drain regions of the 1-byte memory transistors. The device also includes a plurality of global source lines, which are electrically connected to a source region of the byte select transistor. The device further include a plurality of word lines, which are connected to respective gate lines of the 1-byte memory transistors. The device may include a plurality of byte select lines, which are connected to a gate electrode of the byte select transistor. A source region of each of the 1-byte memory transistors and a drain region of the byte select transistor may have a shared junction region. Word lines and byte select lines can be disposed parallel to each other. The shared junction region may be disposed in a doped conductive well region. A part of the shared junction region may be disposed in a doped conductive well region, while the other part of the shared junction region is disposed in a native semiconductor substrate.

DETAILED DESCRIPTION OF THE INVENTION

Figure 1:
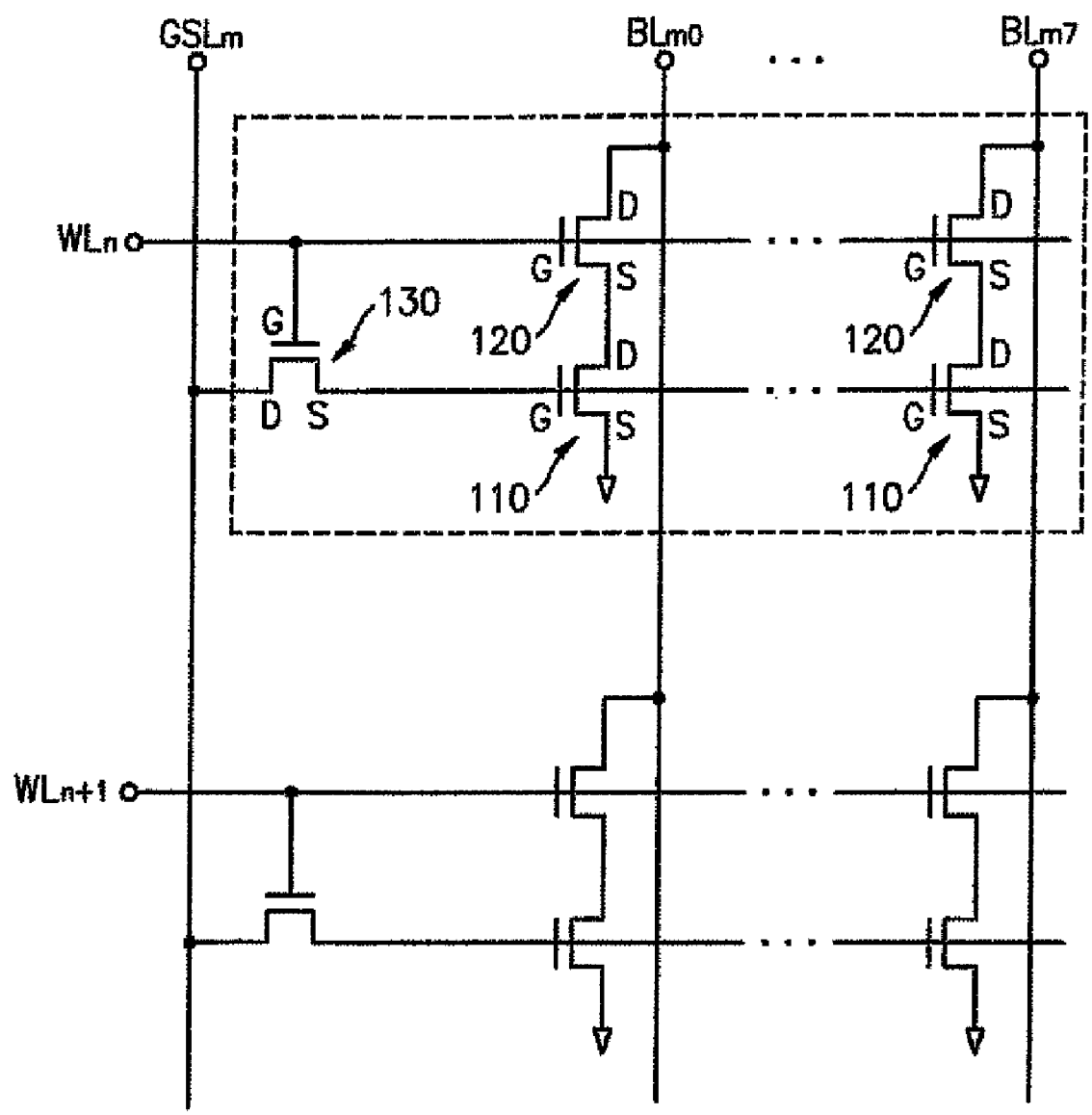
FIG. 1 is an exemplary circuit diagram of a memory cell equivalent circuit of a byte-operational nonvolatile semiconductor memory device.

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the thicknesses of layers may be exaggerated for clarity, and the same reference numerals are used to denote the same elements throughout the drawings.

Figure 2:
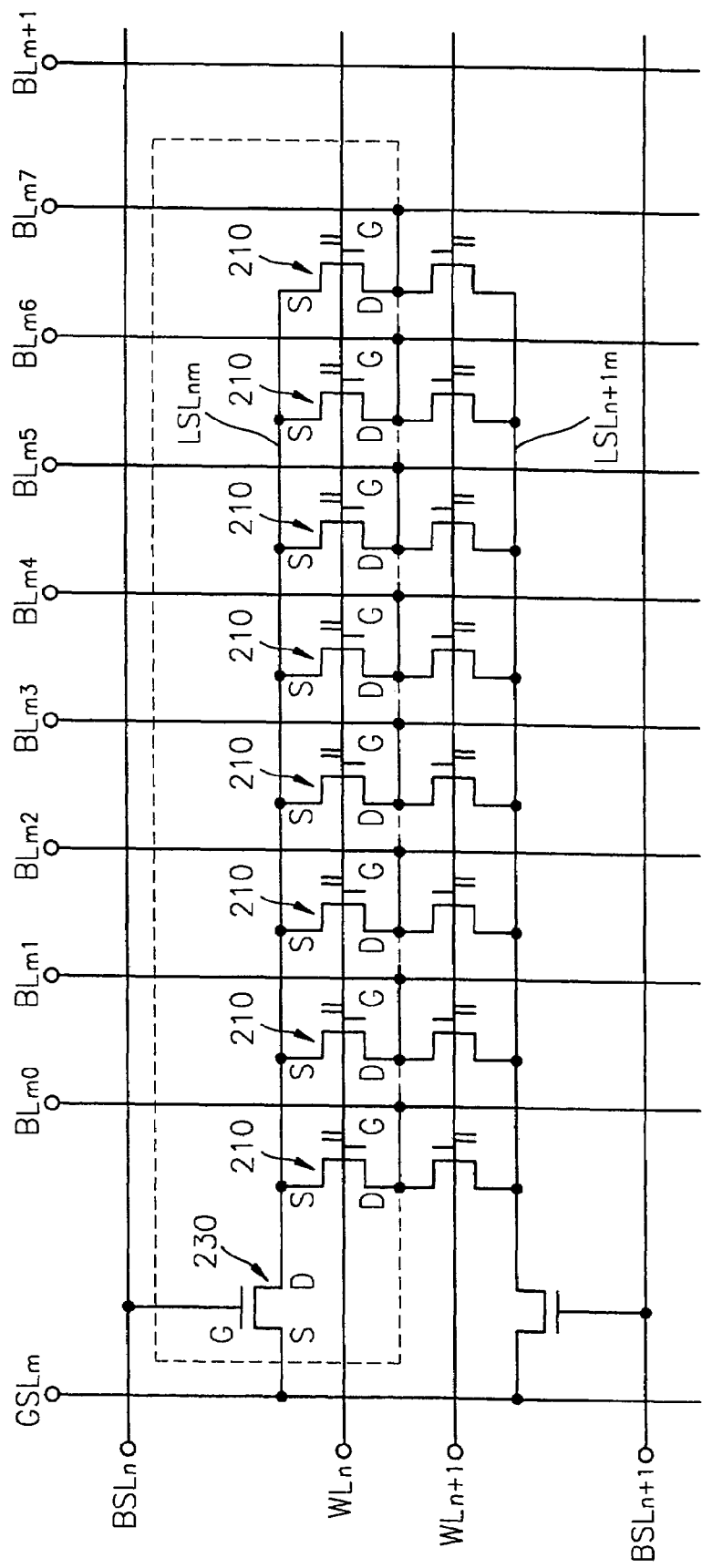
FIG. 2 is an exemplary circuit diagram of a memory cell equivalent circuit of a byte-operational nonvolatile semiconductor memory device.

FIG. 2 is an exemplary circuit diagram of a byte memory cell of a byte-operational non-volatile semiconductor memory device. In FIG. 2, a byte memory cell includes the local source line LSL, the 1-byte memory transistors 210, and the byte select transistor 230. The 1-byte memory transistors 210 and the byte select transistor 230 are connected to the local source line LSL. The byte memory cell may be connected to adjacent byte memory cells through the global source lines GSL, the bit lines BL, the byte select lines BSL, and/or the word lines WL. In FIG. 2, the byte memory cell is illustrated with a dotted line.

A byte memory cell may include a memory cell block including the 1-byte memory transistors 210, the byte-operational block (including the local source line $LSL_{nm}$), and the byte select transistor 230. The 1-byte memory transistors 210 may be connected parallel to the local source line $LSL_{nm}$. Also, the local source line $LSL_{nm}$ may be connected to the byte select transistor 230. The local source line $LSL_{nm}$ may also be connected to the sources S or the drains D of each of the 1-byte memory transistors 210 and the byte select transistor 230. For example, the source S of each of the 1-byte memory transistors 210 and the drain D of the byte select transistor 230 may be respectively connected to the local source line $LSL_{nm}$.

The source S or the drain D of byte select transistor 230 is connected to the $GSL_m$. The gate G of the byte select transistor 230 may be connected to the byte select line $BSL_n$. The source S or the drain D of each of the 1-byte memory transistors 210 may be connected to the mth bit line (i.e. one of $BL_{m0}$ through $BL_{m7}$). The gate G of memory transistor 210 may be connected to the nth word line $WL_n$.

The exemplary equivalent circuit illustrated in FIG. 2 may be characterized by the drain D of the byte select transistor 230 being connected to the source S of each of the 1-byte memory transistors 210. The drain D of the byte select transistor 230 is connected to the source S of each of the 1-byte memory transistors 210 in parallel through the local source line LSL$_{nm}$. Current flowing through a channel of the byte select transistor 230 flows into the bit lines BL through the sources S of the memory transistors 210.

Each 1-byte memory transistor 210 may be a device that operates through F-N tunnelling or source side injection (SSI). For each 1-byte memory transistor 210 operating through SSI, a sufficient difference in electrical potential is required between the source S and the drain D. Also, a sufficient amount of hot electrons or hot holes should be generated in a channel of each memory transistor 210. Accordingly, a sufficient amount of current should flow through the channel of each memory transistor 210.

Current flowing through the single byte select transistor 230 may be supplied to each 1-byte memory transistor 210. Accordingly, current driving capacity of the byte select transistor 230 is relevant for programming, erasing, and reading operations in the memory transistors 210. In other words, the byte select transistor 230 should supply the 1-byte memory transistors 210 with a current required for programming all eight transistors associated with 1-byte of data at the same time. A high voltage should be applied to the source S of each 1-byte memory transistor 210 through the byte select transistor 230 in order to cause a sufficient amount of hot electrons or hot holes to flow into each 1-byte memory transistor 210. For example, during program or erase operations, a high voltage applied through the global source line GSL$_m$ may need to be transmitted to the source S of each 1-byte memory transistor 210. In embodiments, threshold voltage V$_{th}$ of byte select transistor 230 is as low as possible. For example, the threshold voltage V$_{th}$ may be 0V or lower in order to minimize lowering of electrical potential through the byte select transistor 230.

Figure 3:
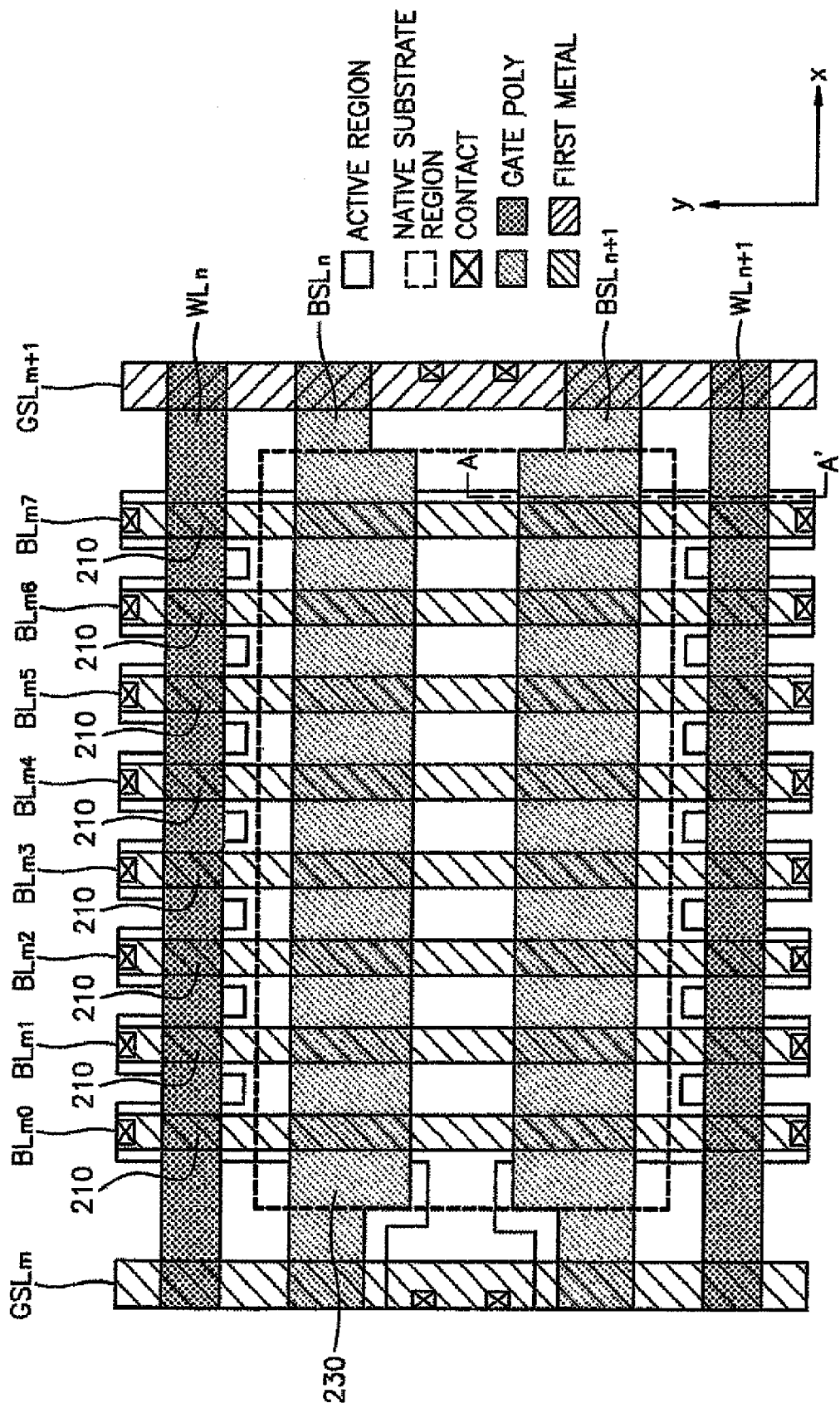
FIG. 3 is an exemplary layout of a memory cell of a byte-operational nonvolatile semiconductor memory device.

FIG. 3 is an exemplary diagram of a byte-operational nonvolatile semiconductor memory device according to the exemplary equivalent circuit of FIG. 2. FIG. 3 shows a layout of adjacent two-byte memory cells, according to embodiments of the present invention. A byte memory cell comprises the 1-byte memory transistors 210 and the byte select transistors 230. The byte memory cell is connected to adjacent byte memory cells through mth bit lines BLm0 through BLm7, the mth global source line GSLm, the nth word line WLn, and the nth byte select line BSLn.

The 1-byte memory transistors 210 are arranged in one direction (e.g. an x-axis direction) in an active region of a semiconductor substrate. A memory block comprises the 1-byte memory transistors 210 and a gate line (which extends to be a part of the nth word line WL$_n$), which connects the gate electrodes of the 1-byte memory transistors 210. The byte select transistor 230 may be located over or under the memory transistors 210 in a direction (e.g. a y-axis direction) perpendicular to the arranged direction of the memory transistors 210. A byte-operational block includes the byte select transistor 230. Memory cell block and the byte select block may be arranged parallel to each other.

Gate electrodes of byte memory cells are connected in the x-axis direction to constitute word line WL$_n$. Gate electrodes of the byte select transistors 230 of the byte memory cell are connected in the x-axis direction to form the byte select line BSL$_n$. Meanwhile, the bit lines BL$_{m0}$ through BL$_{m7}$ and the global source line GSL$_m$ may be arranged in a direction perpendicular to the word line WL$_n$ (i.e., in the y-axis direction). A junction (a drain) of each 1-byte memory transistor 210 is electrically connected to the bit lines BL$_{m0}$ through BL$_{m7}$ through a contact. This contact may be a shared contact, which is connected to a drain of a memory transistor of an adjacent byte memory cell.

The 1-byte memory transistors 210 may be arranged in the x-axis direction. The byte select transistor 230 may be located over or under the memory transistors 210 in the y-axis direction. In other words, a junction of each 1-byte memory transistor 210 and a junction of the byte select transistor 230 may be formed in the same active region and directly adjacent to each other. For example, the junction of each 1-byte memory transistor 210 and the junction of the byte select transistor 230 may constitute a shared junction. In other words, the source of each 1-byte memory transistor 210 and drain of the byte select transistor 230 may form a shared junction.

Since there is a shared junction and the 1-byte memory transistors and the byte select transistor are arranged adjacently, the channel width of byte select transistor 230 can be sufficiently increased. In FIG. 3, the channel width of the byte select transistor 230 is larger than the sum of the channel widths of the eight 1-byte memory transistors 210. In addition, the channel width of the byte select transistor 230 is equal to or larger than the sum of the widths of isolation regions. Each isolation region is located between every two memory transistors 210 and the widths of the 1-byte memory transistors 230. The exemplary layout illustrated FIG. 3 is adequate for a semiconductor device of which programming, erasing, and reading characteristics depend largely on current driving capacity of a byte select transistor. This layout enable manufacture of a byte select transistor with a sufficient channel width. Because the channel width of the byte select transistor is sufficient, the required current for driving all of the 1-byte memory transistors can be supplied through a single byte select transistor. The memory cell layout according to embodiments of the present invention can contribute greatly to high integration of semiconductor memory device, compared to a layout in which a byte select transistor is located on the side of 1-byte memory transistors.

There are complications that arise if a byte select transistor is located on either the right side or left side of 1-byte memory transistors. One complication that arises is that if the byte select transistor is located on either side of the memory transistors, then integration on a chip may be compromised. Further, if the byte select transistor is located on either side of a memory transistors, there may be variance in resistance between respective memory transistors. Accordingly, in embodiments of the present invention, it is advantageous for the byte select transistor 230 to be located either above or below the memory transistors 210. When the byte select transistor 230 is above or below the memory transistors 210, for each of the memory transistors 210, there is a uniform distance to the byte select transistor 230. Accordingly, there may be nominal variance in resistance at each of the memory transistors 210. Additionally, if the byte select transistor 230 is located above or below the memory transistors 210, then each byte memory cell can be easily integrated on a chip.

Exemplary structures of memory transistors and byte select transistors, in accordance with embodiments of the present invention, are illustrated in FIGS. 4A, 4B, 5A, and 5B. FIGS. 4A, 4B, 5A, and 5B are schematic sectional views taken along line A-A' of FIG. 3. As discussed above, each memory transistor 210 is a device that may operate according to either F-N tunneling or source side injection (SSI). However, the illustrations of FIGS. 3, 4A, 5A, and 5B illustrate a device operating according to SSI during programming and/or erasing. However, one of ordinary skill in the art would appreciate that the structures illustrated in FIGS. 3, 4A, 5A, and 5B can be modified to operate according to F-N tunneling during programming and/or erasing. Memory transistor that operates according to SSI, may have a gate electrode structure of a stacked floating gate type, silicon-oxide-nitride-oxide-silicon (SONOS) type, or metal-oxide-nitride-oxide-silicon (MONOS) type.

Figure 4A:
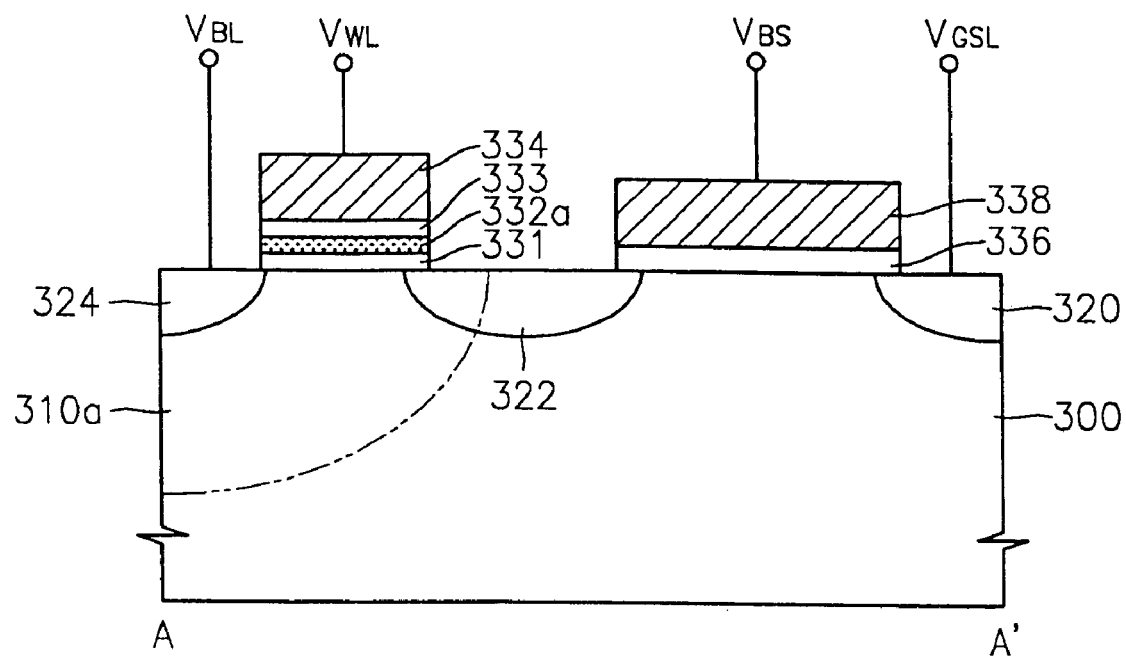
FIGS. 4A, 4B, 5A and 5B are exemplary schematic sectional views taken along line A-A' of FIG. 3.
Figure 4B:
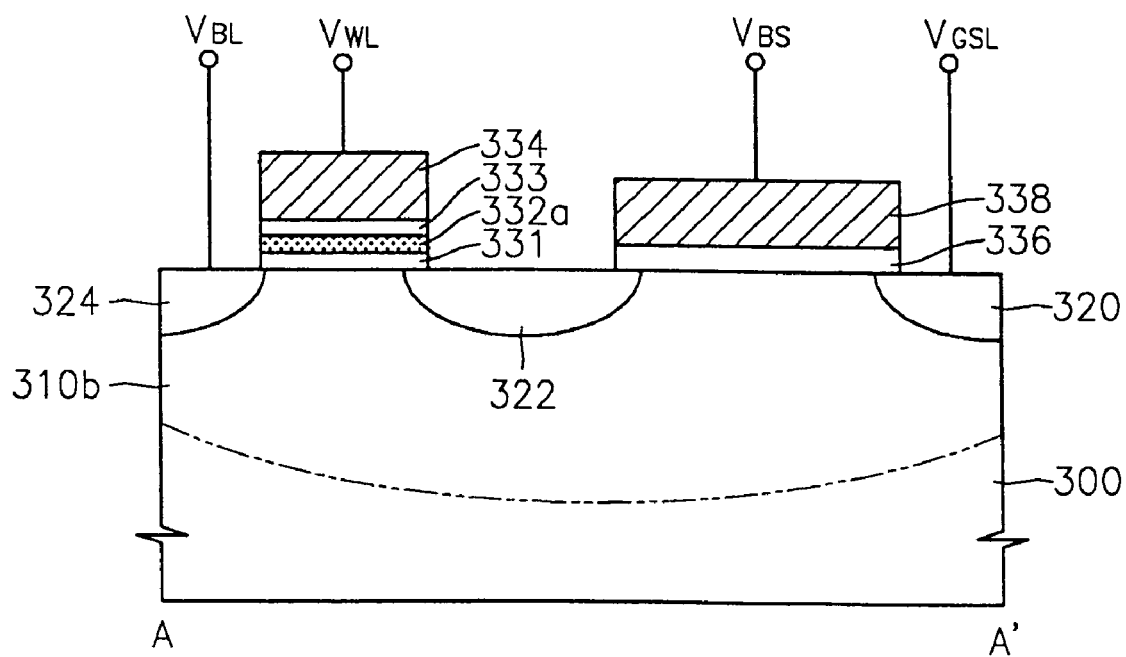
Figure 5A:
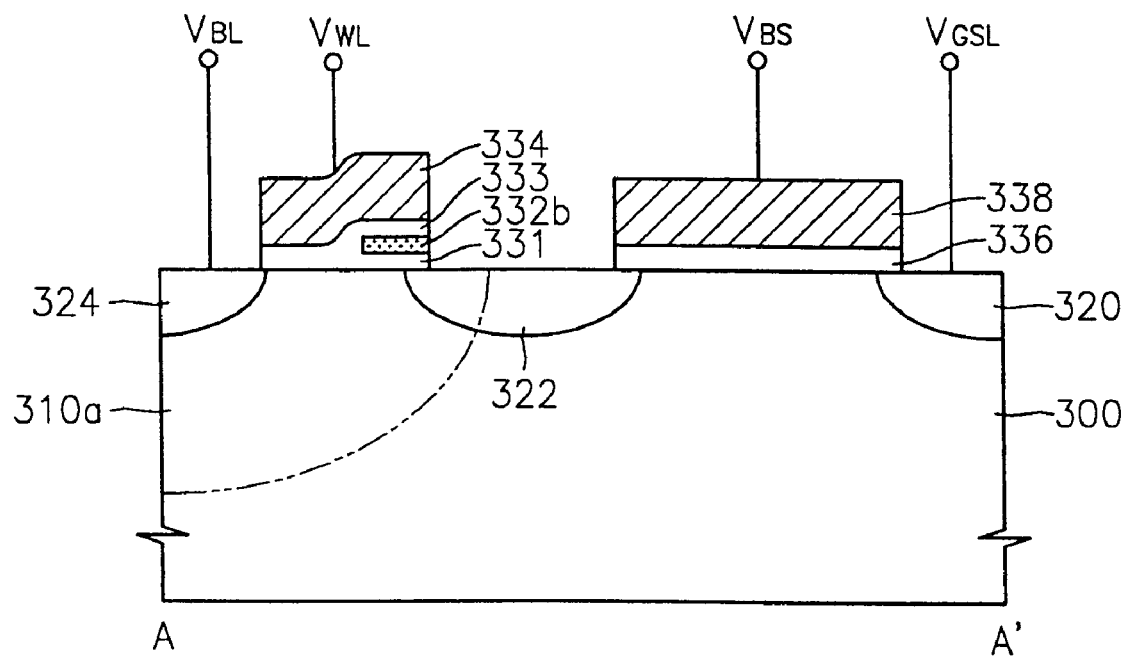
Figure 5B:
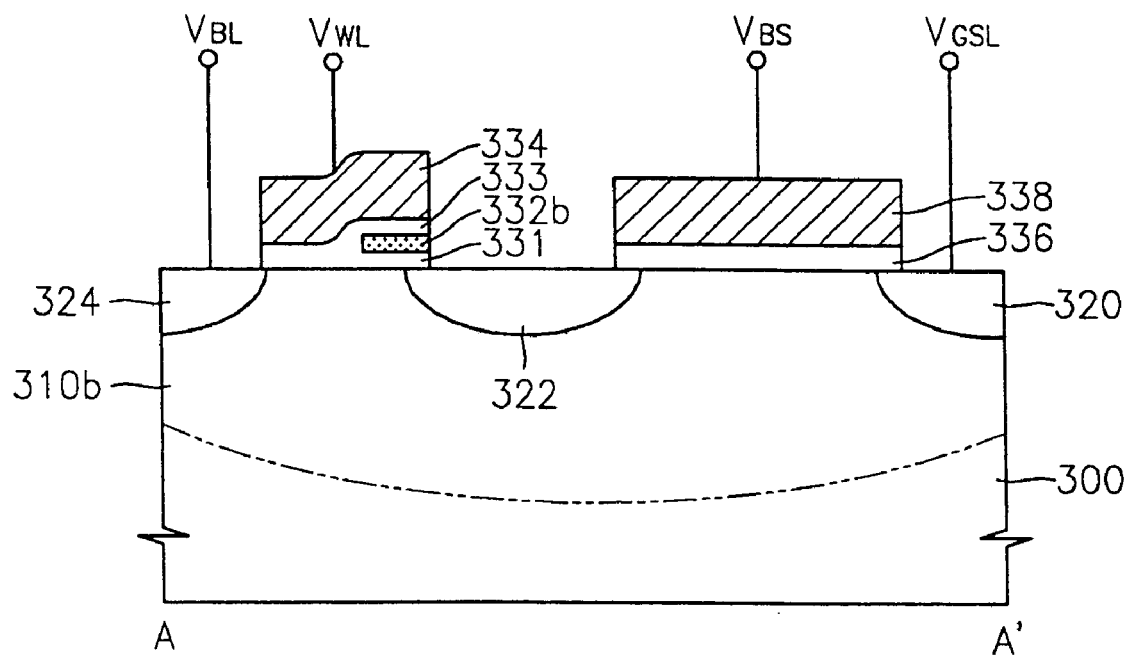

The memory transistor illustrated in FIGS. 4A and 4B have a SONOS-type or MONOS-type gate electrode structure. Hereinafter, both SONOS-type and MONOS-type memory transistors are referred to as a "SONOS-type memory transistors". A SONOS-type memory transistor may include a first oxide layer, a nitride layer, a second oxide layer, and a conductive layer stacked sequentially. These layers may have the same width as a channel region of the memory transistor. The exemplary structures illustrated in FIGS. 5A and 5B are similar to the exemplary structures illustrated in FIGS. 4A and 4B. However, in the exemplary structures of FIGS. 5A and 5B, the width of the nitride layer may be smaller than the channel region of the transistor. In the exemplary structures of FIGS. 5A and 5B, since electrons or holes are injected into and move toward the vicinity of a source of a SONOS-type memory transistor, the nitride layer is typically disposed adjacent to the source of the transistor. In FIGS. 4A, 4B, 5A, and 5B, the left transistor is a memory transistor and the right transistor is a byte select transistor. The memory transistor is illustrated as a SONOS-type memory transistor. However, one of ordinary skill in the art will appreciate that embodiments of the present invention are applicable to different types of memory transistors other than SONOS-type memory transistors.

In FIGS. 4A and 4B, each of the widths of the first oxide layer 331, the nitride layer 332a, the second oxide layer 333, and the polysilicon layer 334 constituting a SONOS memory transistor are substantially equal to the channel width of the transistor. In embodiments where MONOS-type memory transistor is used, the polysilicon layer 334 may be replaced by a metal layer. However, the other materials and structures may otherwise be essentially the same as a SONOS-type memory transistor. In the SONOS-type memory transistor illustrated in FIGS. 5A and 5B, the width of nitride layer 332b may be smaller than the channel width of the transistor. However, each of the widths of the first oxide layer 331, the second oxide layer 333, and the polysilicon layer 334 may be substantially equal to the channel width. In FIGS. 5A and 5B, the nitride layer 332b may be disposed on one side of the SONOS-type memory transistor. In the structures illustrated in FIGS. 4A, 4B, 5A, and 5B, irrespective of the types of the gate electrode structures of the memory transistors, the byte select transistor may have a gate electrode structure where the gate oxide layer 336 and the gate conductive layer 338 are stacked.

Table 1 illustrates examples of voltages applied to elements of byte-operational nonvolatile semiconductor memory devices illustrated in FIGS. 4A, 4B, 5A, and 5B during program, erase, and read operations. $V_{gs1}$ is a voltage applied to a global source line. $V_{bs1}$ is a voltage applied to a byte select line. $V_{w1}$ is a voltage applied to a word line. $V_{b1}$ is a voltage applied to a bit line. $V_b$ is a bulk voltage (i.e. a voltage applied to a silicon substrate).

TABLE 1

| | $V_{gs1}$ | $V_{bs1}$ | $V_{w1}$ | $V_{b1}$ | $V_b$ |
|---|---|---|---|---|---|
| Program | 6 V | 6 V | 5.5 V | 1 V | GND |
| Erase | 6 V | 6 V | −5 V | Floating | GND |
| Read | GND | 1.8 V | 2.5 V or 3.3 V | 0.5 V | GND |

In FIG. 4A, a gate electrode structure of a memory transistor and a gate electrode structure of a byte select transistor are disposed on the semiconductor substrate 300. A channel of the memory transistor is disposed in a first-conductivity-type well region (e.g. the p-type well region 310a). In embodiments, a channel of the byte select transistor may be disposed in a native semiconductor substrate.

The source/drain regions 322 and 324 are disposed in the semiconductor substrate 300 on both sides of the gate electrode structure of the memory transistor. The source/drain region 320 and the source/drain region 322 are disposed in the semiconductor substrate 300 on both sides of the gate electrode structure of the byte select transistor. In embodiments, the source/drain regions 320, 322, and 324 may be formed by implanting n-type impurity ions into the semiconductor substrate 300.

In FIGS. 4A and 5A, according to embodiments, the channel of the memory transistor may be disposed in the p-type well region 310a, while the channel of the byte select transistor is disposed in the native substrate. In other words, the channel of the byte select transistor is not in the well region 310a. If the channel of the byte select transistor is disposed in the native substrate, a threshold voltage of the byte select transistor may be relatively low (e.g. 0 V or lower). If the threshold voltage is 0 V or lower, lowering of electrical potential in a byte select transistor (i.e. a substrate effect) can be minimized. Thus, voltage transmitted to the source/drain region 322 of the memory transistor through the byte select transistor is not lowered. Accordingly, the byte select transistor can secure a sufficient current driving capacity.

In the exemplary semiconductor memory devices illustrated in FIGS. 4B and 5B, according to embodiments of the present invention, the channel of the byte select transistor is disposed in a first-conductivity-type well region (e.g. a p-type well region 310b). Accordingly, the exemplary semiconductor memory devices of FIGS. 4B and 5B have a byte select transistor threshold voltage higher than the exemplary semiconductor devices illustrated in FIGS. 4A and 5A. However, in the embodiments illustrated in FIGS. 4B and 5B, the distance between the gate electrode structures of the byte select transistor and the memory transistor may be less than the embodiment illustrated in FIGS. 4A and 5A. This compactness may be due to both the byte select transistor and the memory transistor being formed in the same p-type well region 310. Accordingly, since the area occupied by a unit byte memory cell can decrease due to reduced distance between the two gate electrode structures, integration density can be increased.

A byte-operational nonvolatile semiconductor memory device may have a memory cell equivalent circuit and a memory cell layout that can be applied to electronic devices requiring byte-operational programming and erasing. Nonvolatile memory devices, in accordance with embodiments of the present invention, may be advantageous for memory cards requiring byte-operational erasing. Byte-operational nonvolatile semiconductor memory devices, according to embodiments of the present invention, improve current driving capacity of the byte select transistor. This improved current driving capacity may improve performance of a memory device.

In a memory cell layout of the byte-operational nonvolatile semiconductor memory device, according to embodiments of the present invention, the byte select transistor may be disposed over or under 1-byte memory transistors, arranged in one direction perpendicular to the arranged direction of the 1-byte memory transistors. A semiconductor memory device, according to embodiments of the present invention, may enable byte operations, may allow a sufficient amount of current to flow through the byte select transistor, and may prevent lowering of voltage in the byte select transistor due to substrate effect. Further, since the area occupied by a unit byte memory cell may be reduced, integration density can be increased and sufficient channel width can be secured in spite of high integration density.

What is claimed is:

1. A byte-operational nonvolatile semiconductor memory device including a plurality of byte memory cells, each byte memory cell comprising:
   a memory cell block comprising a plurality of 1-byte memory transistors arranged in a first direction;
   a byte-operational block comprising a byte select transistor, the byte-operational block extending in the first direction, parallel to the plurality of 1-byte memory transistors, and being positioned a predetermined distance from the memory cell block in a second direction perpendicular to the first direction; and
   a junction region shared by the byte select transistor and each of the plurality of 1-byte memory transistors, wherein a first portion of the shared junction region is in a doped conductive well region and a second portion of the shared junction region is in a native semiconductor substrate.

2. The device of claim 1, further comprising:
   a plurality of bit lines electrically connected to drain regions of the plurality of 1-byte memory transistors, respectively;
   a global source line electrically connected to a source region of the byte select transistor;
   a word line connected to gates of the plurality of 1-byte memory transistors, respectively; and
   a byte select line connected to a gate electrode of the byte select transistor;
   wherein the shared junction region comprises source regions of the plurality of 1-byte memory transistors and a drain region of the byte select transistor.

3. The device of claim 2, wherein the word line extends in the first direction and is parallel to the byte select line.

4. The device of claim 2, wherein the shared junction region is disposed in a doped conductive well region.

5. The device of claim 2, wherein the first portion of the shared junction region comprises the source regions of the plurality of 1-byte memory transistors.

6. The device of claim 2, wherein the source region, the drain region, and a channel region of the byte select transistor are disposed in the native semiconductor substrate.

7. The device of claim 1, wherein the source region, the drain region, and a channel region of the byte select transistor are disposed in a doped conductive well region.

8. The device of claim 7, wherein the source region, the drain region, and a channel region of each of the 1-byte memory transistors are disposed in the doped conductive well region.

9. The device of claim 1, wherein each of the 1-byte memory transistors operates through source side injection.

10. The device of claim 1, wherein a width of a channel region of the byte select transistor is larger than a sum of widths of channel regions of the plurality of 1-byte memory transistors.

11. The device of claim 1, wherein each of the 1-byte memory transistors comprises a floating-gate-type transistor.

12. The device of claim 1, wherein each of the 1-byte memory transistors comprises one of a silicon-oxide-nitride-oxide-silicon-type transistor or a metal-oxide-nitride-oxide-silicon-type memory transistor.

13. The device of claim 12, wherein a gate electrode structure of the silicon-oxide-nitride-oxide-silicon-type transistor or the metal-oxide-nitride-oxide-silicon-type memory transistor includes a first oxide layer, a nitride layer, a second oxide layer, and a conductive layer, which are sequentially stacked and have the same width.

14. The device of claim 12, wherein: a gate electrode structure of the silicon-oxide-nitride-oxide-silicon-type transistor or the metal-oxide-nitride-oxide-silicon-type memory transistor includes a first oxide layer, a nitride layer, a second oxide layer, and a conductive layer, which are sequentially stacked; the first oxide layer, the second oxide layer, and the conductive layer have substantially the same width; and the nitride layer has a width less than the width of the first oxide layer, the second oxide layer, and the conductive layer.

15. A byte memory cell of a byte-operational nonvolatile semiconductor memory, the byte memory cell comprising:
   a memory cell block comprising a plurality of 1-byte memory transistors arranged in a first direction;
   a byte-operational block comprising a byte select transistor, the byte-operational block extending in the first direction, parallel to the plurality of 1-byte memory transistors, and being positioned a predetermined distance from the memory cell block in a second direction perpendicular to the first direction,
   wherein a drain region of the byte select transistor and source regions of the plurality of 1-byte memory transistors form a shared junction region, and
   wherein the drain region of the byte select transistor is in a native semiconductor substrate and the source regions of the plurality of 1-byte memory transistors are in a doped conductive well region.

16. The byte memory cell of claim 15, wherein drain regions of the plurality of 1-byte memory transistors connect to a corresponding plurality of bit lines, and gates of the plurality of 1-byte memory transistors connect to a word line.

17. The byte memory cell of claim 16, wherein a source region of the byte select transistor connects to a global source line, and a gate of the byte select transistor connects to a byte select line.

18. The byte memory cell of claim 15, wherein a width of a channel region of the byte select transistor is greater than a sum of widths of channel regions of the plurality of 1-byte memory transistors.

* * * * *